United States Patent [19]

Kogo

[11] Patent Number: 4,931,798
[45] Date of Patent: Jun. 5, 1990

[54] ELECTROMAGNETIC ANECHOIC CHAMBER WITH AN INNER ELECTROMAGNETIC WAVE REFLECTION SURFACE AND AN ELECTROMAGNETIC WAVE ABSORPTION SMALL BALL DISPOSED IN THE CHAMBER

[75] Inventor: Masanori Kogo, Miyagi, Japan

[73] Assignee: Tokin Corporation, Sendai, Japan

[21] Appl. No.: 201,555

[22] Filed: Jun. 2, 1988

[30] Foreign Application Priority Data

Jun. 3, 1987 [JP] Japan .................. 62-85710[U]

[51] Int. Cl.$^5$ .......................................... H01Q 17/00
[52] U.S. Cl. ................................. 342/4; 342/165
[58] Field of Search ............... 342/1, 4, 5, 165, 166, 342/169, 170, 171, 173

[56] References Cited

U.S. PATENT DOCUMENTS

| | | | |
|---|---|---|---|
| 2,977,591 | 3/1961 | Tanner | 342/1 |
| 3,114,910 | 12/1963 | Rymes | 342/169 |
| 3,120,641 | 2/1964 | Buckley | 455/128 |
| 3,165,742 | 1/1965 | Taylor | 342/169 |
| 3,365,667 | 1/1968 | Deutsch et al. | 455/67 |
| 4,218,683 | 8/1980 | Hemming | 343/703 |
| 4,387,467 | 6/1983 | Kirby | 378/68 |
| 4,521,780 | 6/1985 | Preikschat | 342/377 X |
| 4,695,694 | 9/1987 | Hill et al. | 342/1 X |
| 4,809,003 | 2/1989 | Dominek et al. | 342/165 |

FOREIGN PATENT DOCUMENTS 60-64499 4/1985 Japan.

*Primary Examiner*—Thomas H. Tarcza
*Assistant Examiner*—John B. Sotomayor
*Attorney, Agent, or Firm*—Ladas & Parry

[57] ABSTRACT

For effectively suppressing echo of an electromagnetic wave emitted from an electromagnetic device (24) disposed in a closed space (13) which is defined by a shielding wall (10), an electromagnetic anechoic chamber comprises an absorption member (28) disposed in the space. The wall has an inner surface which reflects the electromagnetic wave into the space as a reflected wave. The reflected wave is directed to a particular position in the space. The absorption member is located at the particular position. Preferably, the inner space is formed along a substantially ellipsoidal shape having a first and a second focus point (14, 16). The electromagnetic device and the absorption member are locsated at the first and the second focus points, respectively.

7 Claims, 3 Drawing Sheets

ELECTROMAGNETIC ANECHOIC CHAMBER WITH AN INNER ELECTROMAGNETIC WAVE REFLECTION SURFACE AND AN ELECTROMAGNETIC WAVE ABSORPTION SMALL BALL DISPOSED IN THE CHAMBER

BACKGROUND OF THE INVENTION (1) Field of the Invention

The present invention relates to an electromagnetic anechoic chamber which provides a closed space for containing an electromagnetic device radiating an electromagnetic wave and for suppressing echo of the radiated electromagnetic wave in the space.

(2) Description of the Prior Art

Presently, various electric and electronic devices, and apparatus including radio systems are in use. Radio systems use and emit electromagnetic waves in space as information transmission media. It is known that electric and electronic devices other than radio systems radiate unintended electromagnetic waves.

Therefore, those electric and electronic devices are collectively called electromagnetic devices.

It is also known that when an electromagnetic device radiates, as a source, such an unintended electromagnetic wave, the unintended electromagnetic wave often obstructs, as noise, the operation of other electromagnetic devices disposed near the source. Therefore, it is desired for all of the electromagnetic devices that such an unintended radiation is as low in level as possible.

In order to counteract the unintended radiation of an electromagnetic device, it is necessary to know the actual and precise level of the unintended radiation itself. It is necessary that measurement of the unintended radiation of the electromagnetic device is carried out under the condition that no electromagnetic wave exists other than the unintended radiation.

Further, it is always required for radio systems to measure their radiation and reception properties of intended electromagnetic waves. Such a measurement also requires a similar condition where no radiation exists other than the intended electromagnetic wave.

In order to provide such a condition for measurement of electromagnetic radiation from an electromagnetic device, an electromagnetic anechoic chamber is known in the prior art.

A conventional electromagnetic anechoic chamber comprises a shielding wall of metal which has an inner surface and an electromagnetic wave absorber layer secured on and covering the inner surface of the shielding wall. Thus, the electromagnetic wave absorber layer defines a closed space. An electromagnetic device to be tested is disposed in the closed space.

The shielding wall prevents any external electromagnetic waves from entering the closed space. The electromagnetic wave absorber layer does not reflect but absorbs the electromagnetic wave emitted from the electromagnetic device disposed in the closed space. As a result, entering neither entering external electromagnetic wave nor echo of the electromagnetic wave emitted from the electromagnetic device in the closed space are present in the closed spaced. Therefore, it is possible to directly measure the electromagnetic wave emitted from the device into the closed space.

However, the conventional electromagnetic anechoic chamber is disadvantageous in that the chamber is expensive because the electromagnetic wave absorber layer must be secured over the entire area of the inner surface of the shielding wall.

SUMMARY OF THE INVENTION

It is therefore an object of the present invention to provide an electromagnetic anechoic chamber in which the electromagnetic wave absorber layer is not applied over the entire area of the inner surface of the shielding wall but echoes of an electromagnetic wave are inexpensively and effectively suppressed in the closed space.

Other objects of this invention will become clear as the description proceeds.

An electromagnetic anechoic chamber provides a closed space for containing an electromagnetic device emitting an electromagnetic wave therein, an echo of the electromagnetic wave being suppressed within the closed space. According to the present invention, the electromagnetic anechoic chamber comprises an electromagnetically shielding wall having an inner surface to define the closed space. The inner surface reflects the electromagnetic wave into the closed space as a reflected wave. The electromagnetic anechoic chamber further comprises electromagnetic absorption means disposed within the closed space for absorbing the reflected wave to thereby remove the reflected wave from the closed space.

DESCRIPTION OF THE PREFERRED EMBODIMENT

Figure 1:
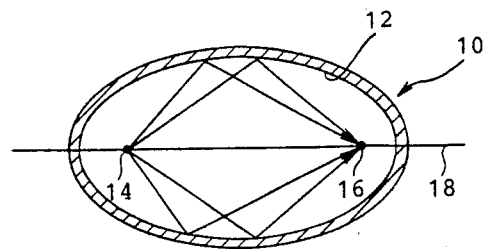
FIG. 1 is a view of a shielding wall of an ellipsoidal shape for illustrating the function of the wall.

Referring to FIG. 1, the principle of an electromagnetic anechoic chamber according to the present invention will be first described. The electromagnetic anechoic chamber comprises an ellipsoidal shielding wall 10 of a selected metal, for example, iron, aluminum, and copper. The shielding wall 10 has an inner surface 12 defining a closed space 13. The inner surface 12 has first and second focus points 14 and 16 on a major axis 18 in the closed space 13.

It will be assumed herein that an electromagnetic wave is emitted from the first focus point 14 as an emitted wave. The emitted wave is reflected at the inner surface 12 of the shielding wall 10 towards the second focus point 16 as a reflected wave. Namely, the reflected wave is focused at the second focus point 16. Therefore, it will be understood that the reflected wave could be absorbed by an electromagnetic wave absorber disposed at the second focus point 16. It is a matter of course that the shielding wall 10 prevents the electromagnetic wave from penetrating therethrough.

Figure 2:
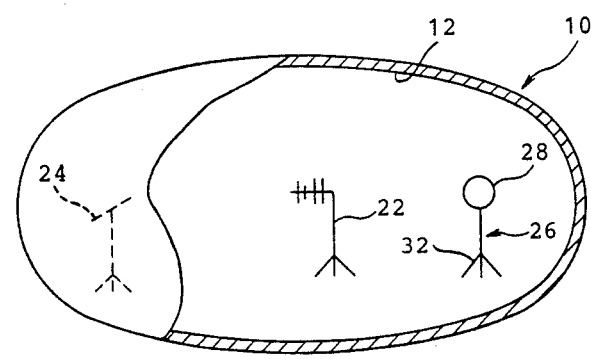
FIG. 2 is a partially broken away elevational view of an electromagnetic anechoic chamber according to a first embodiment of this invention.

Referring to FIG. 2 in addition to FIG. 1, description will be made in relation to an electromagnetic anechoic chamber according to a first embodiment of the present invention. The electromagnetic anechoic chamber is shown for use in measurement of properties of one of receiving and transmitting antennas 22 and 24 which are placed in the closed space 13. The transmitting antenna 24 is located as an electromagnetic device at the first focus point 14 and emits an electromagnetic wave as an emitted wave. The receiving antenna 22 is located between the first and the second focus points 14 and 16. The electromagnetic anechoic chamber further comprises absorption assembly 26 which is placed in the closed space 13. The absorption assembly 26 comprises an absorption member 28 and a supporting member 32 which supports the absorption member 28 at the second focus point 16. The absorption member 28 is made of material for absorbing the electromagnetic wave.

In operation, the emitted wave transfers in the closed space 13 and reaches the shielding wall 10. Then, the emitted wave is reflected by the inner surface 12 of the wall 10 into the closed space 13 as the reflected wave. The reflected wave is directed to the absorption member 28 disposed at the second focus point 16. As a result, the reflected wave is effectively absorbed by the absorption member 28 and is never again reflected by the inner surface. Therefore, no resonance of the emitted wave is caused and the reflected wave never reaches the receiving antenna 22.

The emitted wave has a direct wave which directly reaches the receiving antenna 22 without being reflected at the inner surface 12 of the shielding wall 10. In other words, the receiving antenna 22 receives only the direct wave. Therefore, it is possible to exactly measure the reception or transmission properties of one of the receiving and the transmitting antennas 22 and 24 in the manner known in the art.

Referring to FIGS. 3 through 6, description will be directed to the absorption assembly 26.

Figure 3:
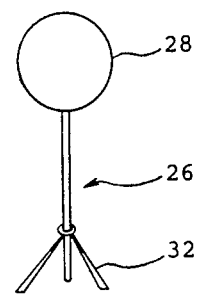
FIG. 3 is a perspective view of an absorption assembly of the electromagnetic anechoic chamber shown in FIG. 2.

In FIG. 3, the absorption member 28 comprises a base member of urethane foam having an outer spherical surface. The base member is impregnated with carbon black. As a result, the absorption member 28 acts to absorb effectively the electromagnetic wave, namely, the reflected wave.

Figure 4:
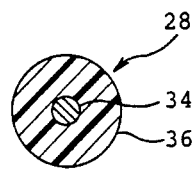
FIG. 4 is a sectional view of an absorption member included in the absorption assembly shown in FIG. 3.

As shown in FIG. 4, it is desirable that the absorption member 28 has an additional member 34 embedded in the base member 36. The additional member 34 may be made of ferrite which serves to absorb effectively the electromagnetic wave.

Figure 5:
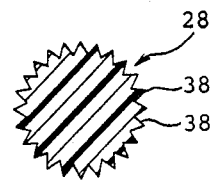
FIG. 5 is a sectional view of a modified example of the absorption member shown in FIG. 3.
Figure 6:
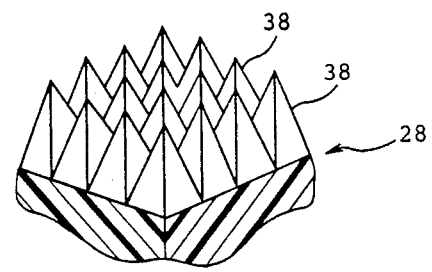
FIG. 6 is a partial view of the modified example shown in FIG. 5.

Referring to FIG. 5, the absorption member 28 is generally spherical and has a plurality of radially outwardly projecting portions 38. Preferably, each of the projecting portions 38 is pyramidal as will be clear from FIG. 6.

Figure 7:
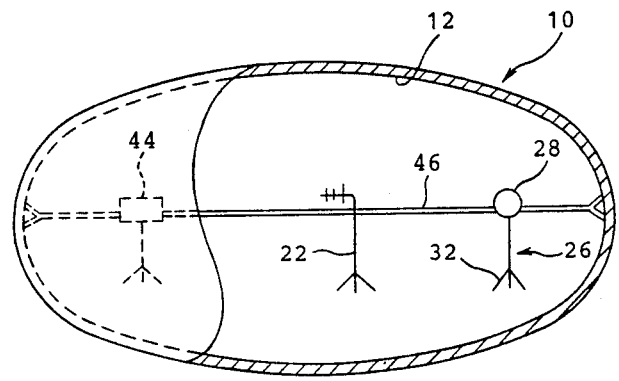
FIG. 7 is a partially broken away elevational view of an electromagnetic anechoic chamber according to a second embodiment of this invention.

Referring to FIG. 7 in addition to FIG. 1, description will be made about an electromagnetic anechoic chamber according to a second embodiment of the present invention. Similar parts are designated by the same reference numerals as FIG. 2. The electromagnetic anechoic chamber is shown in measuring the emitted wave which is emitted from a measured object 44.

The measured object 44 emits the emitted wave and may therefore be referred to herein as the electromagnetic device. The measured object 44 is located at the first focus point 14.

The electromagnetic anechoic chamber further comprises a metal net 46 which extends in a plane containing the major axis and first and second focuses and is supported by the inner surface 12 of the shielding wall 10. The metal net 46 functions as a ground plane for producing a reference wave in response to the emitted wave in the manner known in the art.

In this event, the receiving antenna 22 receives the wave direct and the reference waves without the reflected by the inner surface 12. Therefore, it is possible to exactly measure or evaluate the emitted wave.

Figure 8:
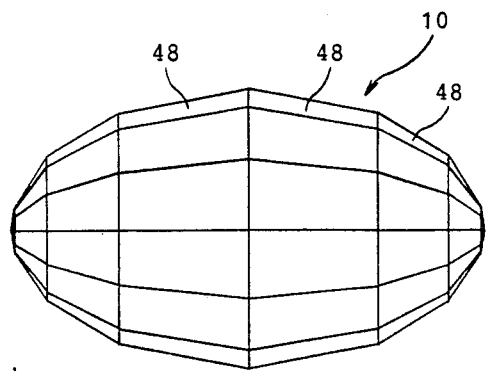
FIG. 8 is a front view of an electromagnetic anechoic chamber according to a third embodiment of this invention.
Figure 8A:
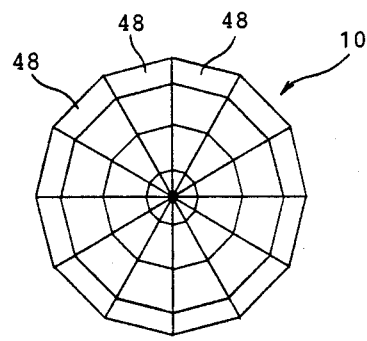
FIG. 8A is a side view of the electromagnetic anechoic chamber shown in FIG. 8.

Referring to FIGS. 8 and 8A, the shielding wall 10 may comprise a plurality of metal plates 48 assembled to one another. The metal plates 48 are connected to one another to generally form the ellipsoidal shape. In order to assemble those plates, frame members can be used which supports those plates to form and maintain the ellipsoidal shape.

Figure 9:
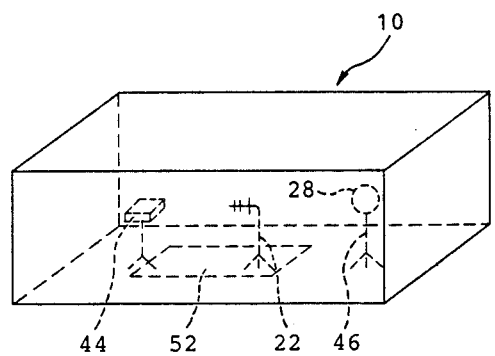
FIG. 9 is a perspective view of an electromagnetic anechoic chamber according to a fourth embodiment of this invention.

The shielding wall 14 may be formed along a rectangular parallelopiped shape as shown in FIG. 9. In FIG. 9, an inner plate 52 is placed in a bottom portion of the shielded space to produce the reference wave. In this event, it will be assumed that the reflected wave is directed to a particular point in the shielded space. Therefore, the absorption member 28 is located at the particular point.

In the case where the reflected wave is directed to a plurality of fixed points, the absorption member 28 is located at each of the fixed points.

What is claimed is:

1. An electromagnetic anechoic chamber for providing a closed space for containing an electromagnetic device emitting an electromagnetic wave therein, an echo of the electromagnetic device being suppressed within said closed space, said electromagnetic anechoic chamber comprising:

an electromagnetically shielding wall having an inner surface of a substantially ellipsoidal shape with a first and a second focus point, said inner surface defining said closed space and reflecting said electromagnetic wave into said closed space as a reflected wave;

electromagnetic absorption means located at said first focus point for absorbing said reflected wave to thereby remove the reflected wave from said closed space; and receiving means located between said first and said second focus points for receiving said electromagnetic wave, said second focus point being determined as a specific point at which said electromagnetic device is located.

2. An electromagnetic anechoic chamber as claimed in claim 1, wherein said shielding wall comprises a plurality of plates which are connected to one another to generally form said substantially ellipsoidal shape.

3. An electromagnetic anechoic chamber as claimed in claim 1, wherein said absorption means comprises a base member of urethane foam and carbon black impregnated in said base member.

4. An electromagnetic anechoic chamber as claimed in claim 3, wherein said absorption means further comprises an additional member mechanically coupled to said base member.

5. An electromagnetic anechoic chamber as claimed in claim 4, wherein said additional member is of ferrite.

6. An electromagnetic anechoic chamber as claimed in claim 3, wherein said base member has a spherical surface.

7. An electromagnetic anechoic chamber as claimed in claim 6, wherein said base member is generally spherical and has a plurality of radially outwardly projecting portions.

* * * * *